United States Patent
Sawada et al.

(10) Patent No.: US 9,961,815 B2
(45) Date of Patent: May 1, 2018

(54) SERIES OF ELECTRONIC COMPONENTS STORED IN A TAPE, MANUFACTURING METHOD FOR SERIES OF ELECTRONIC COMPONENTS STORED IN A TAPE, AND ELECTRONIC COMPONENT

(71) Applicant: Murata Manufacturing Co., Ltd., Nagaokakyo-shi, Kyoto-fu (JP)

(72) Inventors: Takashi Sawada, Nagaokakyo (JP); Hirotaka Nakazawa, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 222 days.

(21) Appl. No.: 14/872,375

(22) Filed: Oct. 1, 2015

(65) Prior Publication Data

US 2016/0128244 A1 May 5, 2016

(30) Foreign Application Priority Data

Oct. 29, 2014 (JP) .................................. 2014-219900
Jun. 2, 2015 (JP) .................................. 2015-112294

(51) Int. Cl.
| | | |
|---|---|---|
| *H01G 4/232* | (2006.01) | |
| *H01G 4/30* | (2006.01) | |
| *H05K 13/00* | (2006.01) | |
| *H01G 4/12* | (2006.01) | |
| *H01L 41/08* | (2006.01) | |
| *H01G 4/008* | (2006.01) | |

(52) U.S. Cl.
CPC ....... *H05K 13/0084* (2013.01); *H01G 4/1227* (2013.01); *H01G 4/232* (2013.01); *H01G 4/30* (2013.01); *H01G 4/0085* (2013.01); *H01L 41/08* (2013.01)

(58) Field of Classification Search
CPC ........... H01G 4/228; H01G 4/232; H01G 4/30
See application file for complete search history.

(56) References Cited

U.S. PATENT DOCUMENTS

| | | | |
|---|---|---|---|
| 2013/0250476 A1 | 9/2013 | Chung et al. | |
| 2013/0321981 A1* | 12/2013 | Ahn | ........ H01G 4/30 361/321.2 |
| 2016/0005539 A1* | 1/2016 | Lee | ........ H01G 2/065 174/260 |

FOREIGN PATENT DOCUMENTS

JP    2013-201417 A    10/2013

* cited by examiner

*Primary Examiner* — Eric Thomas
(74) *Attorney, Agent, or Firm* — Keating & Bennett, LLP (57) ABSTRACT

A series of electronic components stored in a tape include a plurality of electronic components each arranged such that a first main surface faces a bottom surface of a cavity. In each electronic component, on a first side surface, a thickness in a width direction of a first terminal electrode at a first main surface side is smaller than a thickness in the width direction of the first terminal electrode at a second main surface side, and on a second side surface, a thickness in the width direction of a second terminal electrode at the first main surface side is smaller than a thickness in the width direction of the second terminal electrode at the second main surface side.

15 Claims, 6 Drawing Sheets

SERIES OF ELECTRONIC COMPONENTS STORED IN A TAPE, MANUFACTURING METHOD FOR SERIES OF ELECTRONIC COMPONENTS STORED IN A TAPE, AND ELECTRONIC COMPONENT

BACKGROUND OF THE INVENTION

1. Field of the Invention

The present invention relates to a series of electronic components stored in a tape, a manufacturing method for a series of electronic components stored in a tape, and an electronic component.

2. Description of the Related Art

To date, a large number of electronic components such as multilayer ceramic capacitors are used in a variety of electronic devices. For example, as an example of an electronic component, in Japanese Unexamined Patent Application Publication No. 2013-201417, a multilayer ceramic capacitor is described in which signal terminal electrodes are provided on first and second end surfaces of a ceramic body and grounding terminal electrodes are provided on first and second side surfaces of the ceramic body.

Usually, a multilayer ceramic capacitor is mounted on a mounting substrate using a bonding material such as solder. Consequently, it is required that the multilayer ceramic capacitor have high moisture resistance reliability in the multilayer ceramic capacitor mounting structure.

SUMMARY OF THE INVENTION

Preferred embodiments of the present invention improve the moisture resistance reliability of an electronic component in an electronic component mounting structure.

A series of electronic components stored in a tape according to a preferred embodiment of the present invention includes a tape and a plurality of electronic components. The tape includes a long carrier tape and a cover tape. A plurality of cavities are provided in the carrier tape in a longitudinal direction of the carrier tape. The cover tape is provided on top of the carrier tape so as to cover the plurality of cavities. The plurality of electronic components are respectively arranged in the plurality of cavities. Each of at least two of the plurality of electronic components arranged in a row includes an electronic component body, a first inner electrode, a second inner electrode, a first terminal electrode, a second terminal electrode, a third terminal electrode and a fourth terminal electrode. The electronic component body includes first and second main surfaces, first and second side surfaces and first and second end surfaces. The first and second main surfaces extend in a length direction and a width direction. The first and second side surfaces extend in the length direction and a height direction. The first and second end surfaces extend in the width direction and the height direction. The first inner electrode is provided inside the electronic component body. The first inner electrode extends out to the first and second side surfaces. The second inner electrode is provided inside the electronic component body. The second inner electrode extends out to the first and second end surfaces. The first terminal electrode is arranged on the first side surface. The first terminal electrode is electrically connected to the first inner electrode. The second terminal electrode is arranged on the second side surface. The second terminal electrode is electrically connected to the first inner electrode. The third terminal electrode is arranged on the first end surface. The third terminal electrode is electrically connected to the second inner electrode. The fourth terminal electrode is arranged on the second end surface. The fourth terminal electrode is electrically connected to the second inner electrode. On the first side surface, a thickness in the width direction of the first terminal electrode at the first main surface side is smaller than a thickness in the width direction of the first terminal electrode at the second main surface side. On the second side surface, a thickness in the width direction of the second terminal electrode at the first main surface side is smaller than a thickness in the width direction of the second terminal electrode at the second main surface side. Each of the at least two of the plurality of electronic components arranged in a row is arranged such that the first main surface faces a bottom surface of the cavity.

In the series of electronic components stored in a tape according to a preferred embodiment of the present invention, it is preferable that the first and second terminal electrodes each include a fired electrode layer.

A manufacturing method according to a preferred embodiment of the present invention is provided for a series of electronic components stored in a tape including a tape including a long carrier tape provided with a plurality of cavities in a longitudinal direction of the carrier tape and a cover tape provided on top of the carrier tape so as to cover the plurality of cavities, and a plurality of electronic components respectively arranged in the plurality of cavities. Each of at least two of the plurality of electronic components arranged in a row includes an electronic component body including first and second main surfaces that extend in a length direction and a width direction, first and second side surfaces that extend in the length direction and a height direction, and first and second end surfaces that extend in the width direction and the height direction, a first inner electrode provided inside the electronic component body and extending to the first and second side surfaces, a second inner electrode provided inside the electronic component body and extending to the first and second end surfaces, a first terminal electrode arranged on the first side surface and electrically connected to the first inner electrode, a second terminal electrode arranged on the second side surface and electrically connected to the first inner electrode, a third terminal electrode arranged on the first end surface and electrically connected to the second inner electrode, and a fourth terminal electrode arranged on the second end surface and electrically connected to the second inner electrode. On the first side surface, a thickness in the width direction of the first terminal electrode at the first main surface side is smaller than a thickness in the width direction of the first terminal electrode at the second main surface side. On the second side surface, a thickness in the width direction of the second terminal electrode at the first main surface side is smaller than a thickness in the width direction of the second terminal electrode at the second main surface side. The manufacturing method according to a preferred embodiment of the present invention for a series of electronic components stored in a tape, includes a step of arranging each of the at least two of the plurality of electronic components arranged in a row so that the first main surface faces a bottom surface of the cavity.

An electronic component according to a preferred embodiment of the present invention includes an electronic component body, a first inner electrode, a second inner electrode, a first terminal electrode, a second terminal electrode, a third terminal electrode and a fourth terminal electrode. The electronic component body includes first and second main surfaces, first and second side surfaces and first and second end surfaces. The first and second main surfaces extend in a length direction and a width direction. The first and second side surfaces extend in the length direction and a height direction. The first and second end surfaces extend in the width direction and the height direction. The first inner electrode is provided inside the electronic component body. The first inner electrode extends to the first and second side surfaces. The second inner electrode is provided inside the electronic component body. The second inner electrode extends to the first and second end surfaces. The first terminal electrode is arranged on the first side surface. The first terminal electrode is electrically connected to the first inner electrode. The second terminal electrode is arranged on the second side surface. The second terminal electrode is electrically connected to the first inner electrode. The third terminal electrode is arranged on the first end surface. The third terminal electrode is electrically connected to the second inner electrode. The fourth terminal electrode is arranged on the second end surface. The fourth terminal electrode is electrically connected to the second inner electrode. On the first side surface, a thickness in the width direction of the first terminal electrode at the first main surface side is smaller than a thickness in the width direction of the first terminal electrode at the second main surface side. On the second side surface, a thickness in the width direction of the second terminal electrode at the first main surface side is smaller than a thickness in the width direction of the second terminal electrode at the second main surface side.

In the electronic component according to a preferred embodiment of the present invention, it is preferable that the first and second terminal electrodes each include a fired electrode layer.

According to preferred embodiments of the present invention, the moisture resistance reliability of an electronic component in an electronic component mounting structure is significantly improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, examples of preferred embodiments of the present invention will be described. However, the following preferred embodiments are merely illustrative examples. The present invention is in no way limited to the following preferred embodiments.

In addition, in the drawings referred to in the description of preferred embodiments and so forth, members having substantially the same functions are referred to using the same symbols. In addition, the drawings referred to in the description of preferred embodiments of the present invention and so forth are schematic drawings. The dimensional ratios and so forth of bodies drawn in the drawings may differ from the dimensional ratios and so forth of the actual bodies. The dimensional ratios and so forth of bodies may also differ from drawing to drawing. The specific dimensional ratios and so forth of bodies should be determined by referring to the following description.

Figure 1:
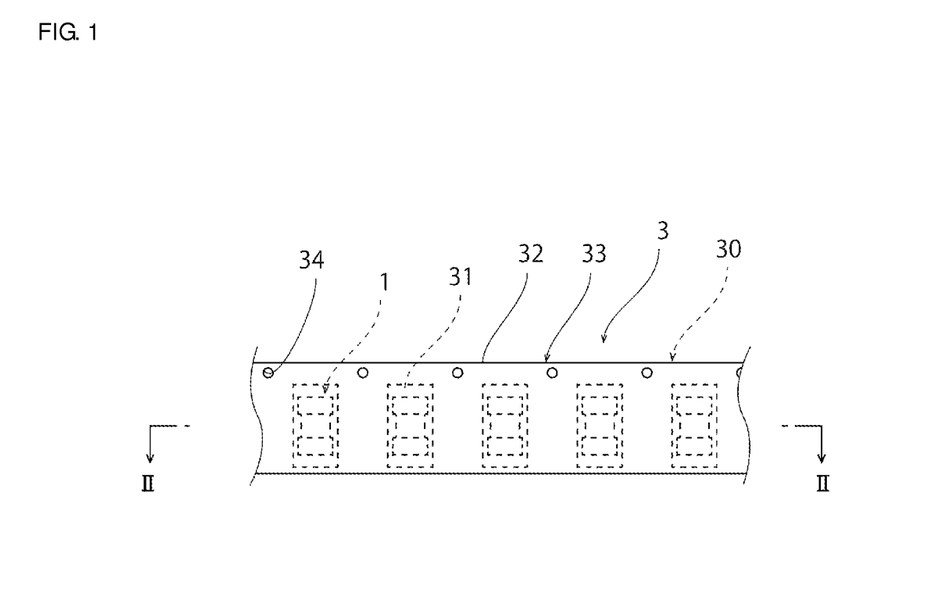
FIG. 1 is a schematic plan view of a series of electronic components stored in a tape according to a preferred embodiment of the present invention.
Figure 2:
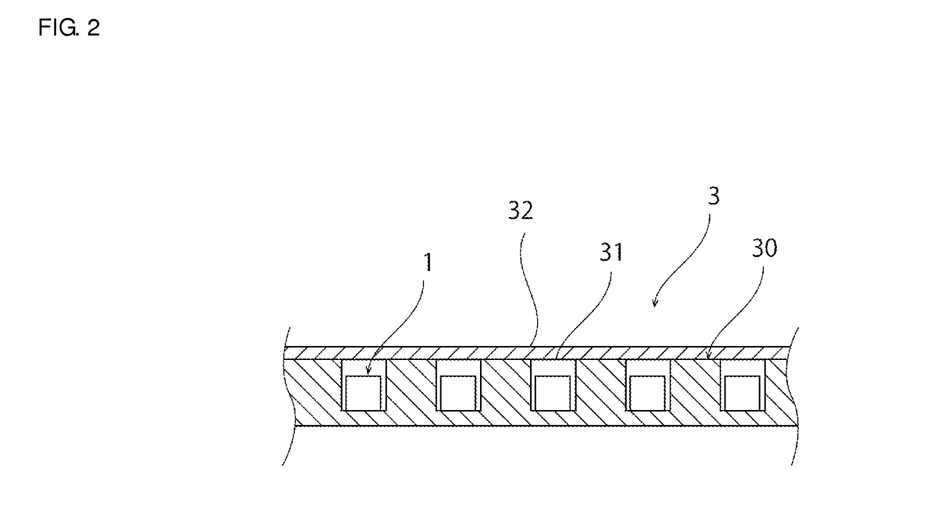
FIG. 2 is a schematic sectional view taken along line II-II of FIG. 1.

FIG. 1 is a schematic plan view of a series of electronic components stored in a tape according to a preferred embodiment of the present invention. FIG. 2 is a schematic sectional view taken along line II-II of FIG. 1. As illustrated in FIGS. 1 and 2, a series of electronic components stored in a tape 3 is a structure in which a plurality of electronic components are fixed in place by taping.

The series of electronic components stored in a tape 3 includes a long tape 33 including feed holes 34. The tape 33 includes an elongated carrier tape 30 and a long cover tape 32. A plurality of cavities 31 are provided in the carrier tape 30 at uniform intervals in the longitudinal direction of the carrier tape 30. Each cavity 31 has a rectangular or substantially rectangular shape in plan view in this preferred embodiment. The cavities 31 are open at one surface of the carrier tape 30. A multilayer ceramic capacitor 1 is accommodated inside each of the cavities 31 as an electronic component. The size of each cavity 31 is such that the multilayer ceramic capacitor 1 is accommodated thereinside. The size of each cavity 31 is determined in accordance with the dimensions of the shape of the accommodated multilayer ceramic capacitor 1. A clearance between the cavity 31 and the multilayer ceramic capacitor 1 preferably is about 10% or more and about 35% or less the dimensions of the multilayer ceramic capacitor 1, for example. The size of cavities 31 is set to a size such that the multilayer ceramic capacitors 1 do not rotate inside the cavities 31.

The cover tape 32 is provided on top of the carrier tape 30 so as to cover the cavities 31. Specifically, the cover tape 32 is formed of a suitable synthetic resin film for example. The cover tape 32 is affixed to the carrier tape 30 using an adhesive. Thus, the cavities 31 are sealed. When the multilayer ceramic capacitors 1 are to be removed from the series of electronic components stored in a tape 3, the cover tape 32 is peeled off.

The carrier tape 30 is formed of a suitable material such as paper or a synthetic resin. The carrier tape 30 may be formed of a multilayer member. The carrier tape 30 may be a multilayer body including a member in which through holes defining the cavities 31 are formed and another member that defines a bottom surface of the cavities 31.

In this preferred embodiment, an example will be described in which the electronic components accommodated in the cavities 31 are multilayer ceramic capacitors. However, the electronic components accommodated in the cavities of preferred embodiments of the present invention are not limited to being multilayer ceramic capacitors. In various preferred embodiments of the present invention, capacitors other than multilayer ceramic capacitors, piezoelectric components, thermistors or inductors may be accommodated in the cavities 31, for example. That is, the electronic components may be capacitors, piezoelectric components, thermistors, inductors and so forth.

Next, the configuration of the multilayer ceramic capacitors 1 accommodated in the cavities 31 will be described. The multilayer ceramic capacitors 1 described below are merely examples. In the present invention, capacitors having a configuration other than that of the multilayer ceramic capacitors 1 may be accommodated in the cavities 31.

Figure 3:
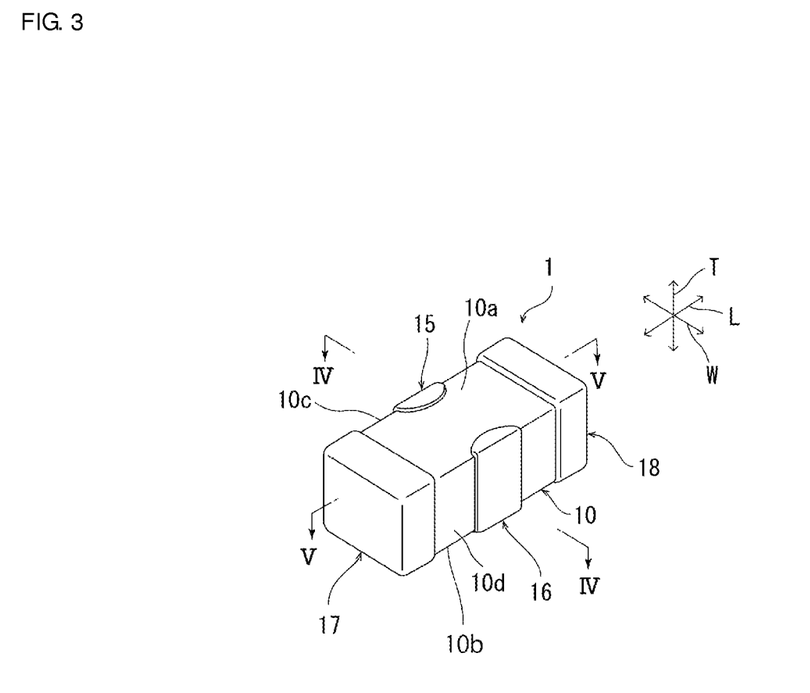
FIG. 3 is a schematic perspective view of a multilayer ceramic capacitor of a preferred embodiment of the present invention.
Figure 4:
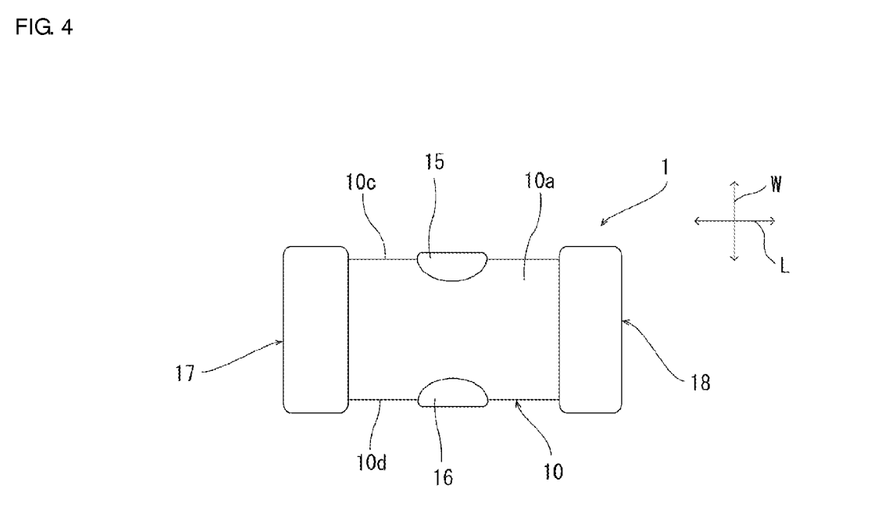
FIG. 4 is a schematic plan view of the multilayer ceramic capacitor of a preferred embodiment of the present invention.
Figure 5:
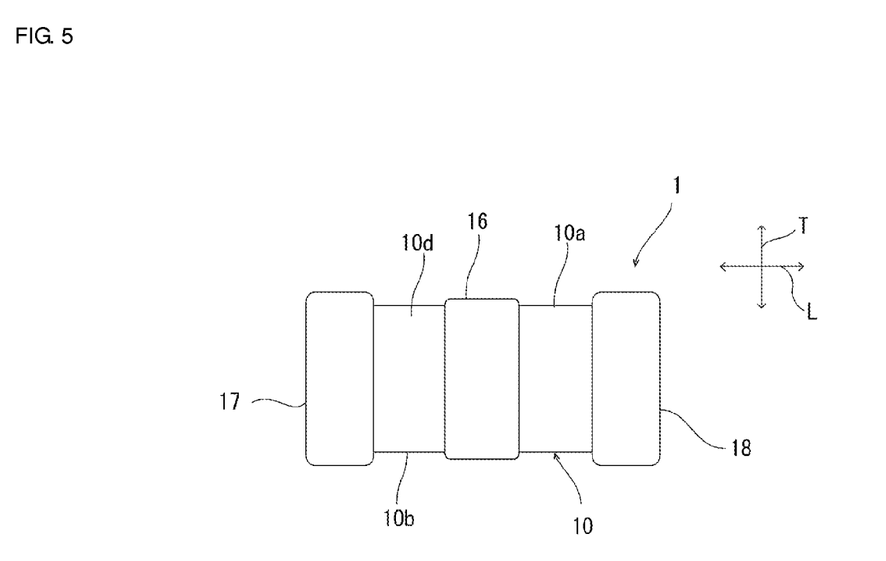
FIG. 5 is a schematic side view of the multilayer ceramic capacitor of a preferred embodiment of the present invention.
Figure 6:
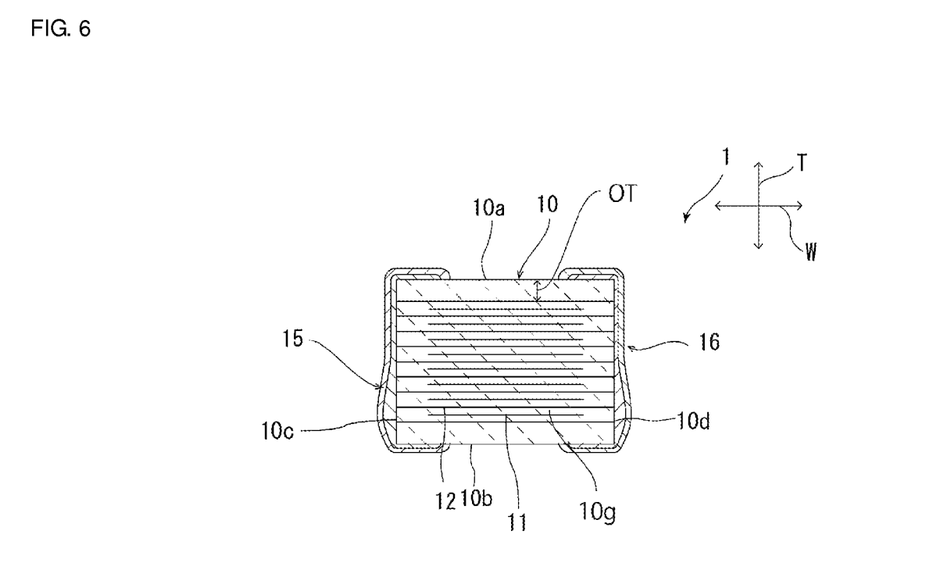
FIG. 6 is a schematic sectional view taken along line IV-IV of FIG. 3.
Figure 7:
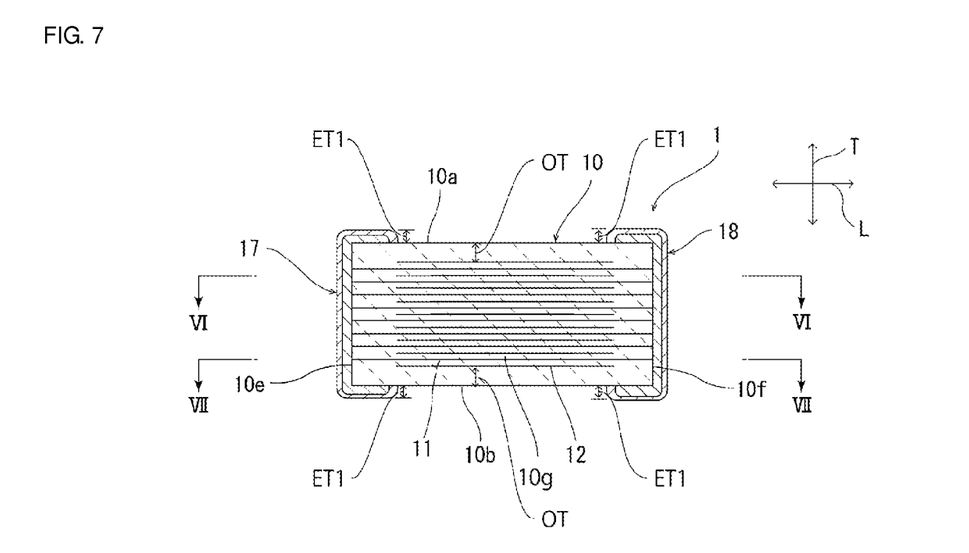
FIG. 7 is a schematic sectional view taken along line V-V of FIG. 3.
Figure 8:
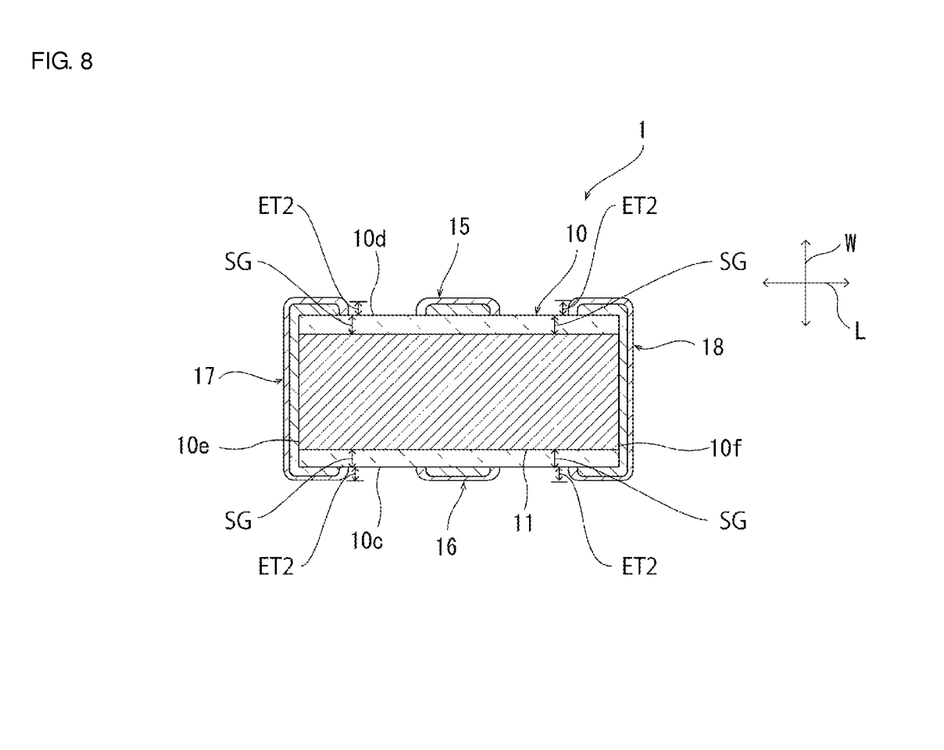
FIG. 8 is a schematic sectional view taken along line VI-VI of FIG. 7.
Figure 9:
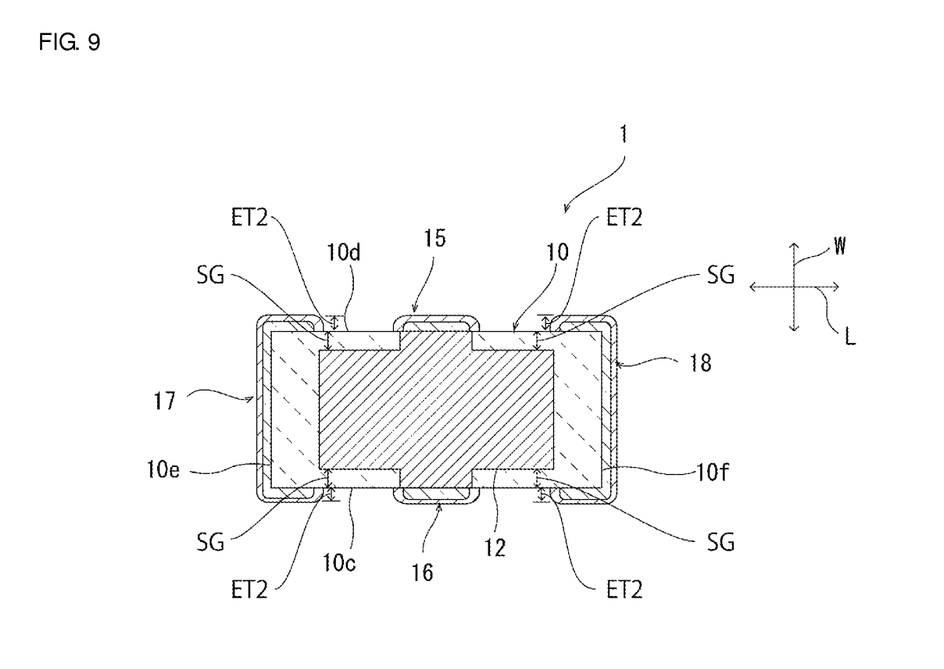
FIG. 9 is a schematic sectional view taken along line VII-VII of FIG. 7.

FIG. 3 is a schematic perspective view of a multilayer ceramic capacitor of this preferred embodiment. FIG. 4 is a schematic plan view of the multilayer ceramic capacitor of this preferred embodiment. FIG. 5 is a schematic side view of the multilayer ceramic capacitor of this preferred embodiment. FIG. 6 is a schematic sectional view taken along line IV-IV of FIG. 3. FIG. 7 is a schematic sectional view taken along line V-V of FIG. 3. FIG. 8 is a schematic sectional view taken along line VI-VI of FIG. 7. FIG. 9 is a schematic sectional view taken along line VII-VII of FIG. 7.

As illustrated in FIGS. 3 to 5, the multilayer ceramic capacitor 1 includes a ceramic body 10. The ceramic body 10 preferably has a rectangular or substantially rectangular parallelepiped shape. Corner portions and edge portions of the ceramic body 10 may be provided in a chamfered or substantially chamfered shape or may have a rounded or substantially rounded shape. In addition, irregularities may be provided on main surfaces and side surfaces of the ceramic body 10.

The ceramic body 10 includes first and second main surfaces 10a and 10b, first and second side surfaces 10c and 10d and first and second end surfaces 10e and 10f.

The first and second main surfaces 10a and 10b each extend in a length direction L and a width direction W. The length direction L is orthogonal to the width direction W. The first main surface 10a and the second main surface 10b oppose each other in a height direction T. The height direction T is orthogonal to the length direction L and the width direction W.

The first and second side surfaces 10c and 10d each extend in the length direction L and the height direction T. The first side surface 10c and the second side surface 10d oppose each other in the width direction W.

The first and second end surfaces 10e and 10f each extend in the width direction W and the height direction T. The first end surface 10e and the second end surface 10f oppose each other in the length direction L.

The ceramic body 10 may be formed of a dielectric ceramic for example. Specific examples of a dielectric ceramic include $BaTiO_3$, $CaTiO_3$, $SrTiO_3$ and $CaZrO_3$. For example, a Mn compound, a Mg compound, a Si compound, an Fe compound, a Cr compound, a Co compound, a Ni compound or a rare earth compound may be added to the ceramic body 10.

As illustrated in FIGS. 6 to 9, first inner electrodes and second inner electrodes 12 are provided inside the ceramic body 10.

As illustrated in FIGS. 6 and 7, the first inner electrodes 11 and the second inner electrodes 12 oppose each other with ceramic portions 10g interposed therebetween in the height direction T.

As illustrated in FIGS. 7 and 8, the first inner electrodes 11 extend to the first end surface 10e and the second end surface 10f. The first inner electrodes 11 are spaced apart from the first and second side surfaces 10c and 10d. As illustrated in FIGS. 6 and 9, the second inner electrodes 12 extend to the first side surface 10c and the second side surface 10d. The second inner electrodes 12 do not extend to the first end surface 10e and the second end surface 10f.

The first and second inner electrodes 11 and 12 may be formed of a metal such as Ni, Cu, Ag, Pd, Au or a Ag—Pd alloy.

As illustrated in FIGS. 3 and 4, a first terminal electrode 15 is provided on the first side surface 10c. Specifically, the first terminal electrode 15 is provided in a central portion of the first side surface 10c in the length direction L. As illustrated in FIG. 6, the first terminal electrode 15 extends from on the first side surface 10c onto both the first and second main surfaces 10a and 10b.

On the first side surface 10c, a thickness in the width direction of the first terminal electrode 15 at the first main surface 10a side is smaller than a thickness in the width direction of the first terminal electrode 15 at the second main surface 10b side.

As illustrated in FIGS. 3 to 5, a second terminal electrode 16 is provided on the second side surface 10d.

Specifically, the second terminal electrode 16 is provided in a central portion of the second side surface 10d in the length direction L. As illustrated in FIG. 6, the second terminal electrode 16 extends from on the second side surface 10d onto both the first and second main surfaces 10a and 10b.

On the second side surface 10d, a thickness in the width direction of the second terminal electrode 16 at the first main surface 10a side is smaller than a thickness in the width direction of the second terminal electrode 16 at the second main surface 10b side.

As illustrated in FIGS. 7 to 9, a third terminal electrode 17 is provided on the first end surface 10e. The third terminal electrode 17 extends from on the first end surface 10e onto both the first and second main surfaces 10a and 10b and onto both the first and second side surfaces 10c and 10d.

A fourth terminal electrode 18 is provided on the second end surface 10f. The fourth terminal electrode 18 extends from on the second end surface 10f onto both the first and second main surfaces 10a and 10b and onto both the first and second side surfaces 10c and 10d.

The terminal electrodes 15 to 18 may be formed of a suitable conductive agent such as Ni, Cu, Ag, Pd, Au or a Ag—Pd alloy. Each of the terminal electrodes 15 to 18 may be formed of a multilayer body including a fired electrode layer including a glass and a plating layer formed on top of the fired electrode layer.

The thickness of the terminal electrodes 15 to 18 can be measured by performing observation using a scanning electron microscope of an area of 30 μm of a cross-section obtained by grinding down a side surface or an end surface of the ceramic body to ½ the thickness of the ceramic body, for example.

Next, a non-limiting example of a manufacturing method for the multilayer ceramic capacitor 1 will be described. The multilayer ceramic capacitor 1 may be manufactured with the following procedure, for example.

First, ceramic green sheets containing a ceramic powder are prepared. The ceramic green sheets can be manufactured by, for example, applying a ceramic paste containing a ceramic powder and so forth.

Next, conductive paste layers for forming the first and second inner electrodes 11 and 12 are formed by applying a conductive paste onto the ceramic green sheets. Application of the conductive paste may be performed by using any of various printing methods such as a screen printing method for example.

Next, the ceramic green sheets to which conductive paste layers have not been applied and the ceramic green sheets to which conductive paste layers have been applied are appropriately stacked on top of one another and subjected to pressing, and thus a mother multilayer body is manufactured.

Next, the mother multilayer body is cut along imaginary cut lines and thus a plurality of green ceramic bodies are manufactured from the mother multilayer body. Cutting of the mother multilayer body may be carried out by performing cutting with a dicing machine or by performing pressing and cutting.

After manufacture of the green ceramic bodies, edge portions and chamfers of edge portions or rounding chamfers and surfaces layers of the green ceramic bodies may be ground by barrel grinding or the like.

Next, the green ceramic bodies are fired. The firing temperature can be appropriately set in accordance with the types of ceramic material and conductive paste used.

Next, the terminal electrodes 15 to 18 are formed. The terminal electrodes 15 to 18 can be formed by, for example, baking a conductive paste on the ceramic body. In the case where the terminal electrodes 15 to 18 are to be each formed of a multilayer body made up of a fired electrode layer and a plating layer formed on the fired electrode layer, the plating layer can be formed by performing plating after the conductive paste layer has been baked.

In this preferred embodiment, on the first side surface 10c, a thickness in the width direction of the first terminal electrode 15 at the first main surface 10a side is smaller than a thickness in the width direction of the first terminal electrode 15 at the second main surface 10b side. On the second side surface 10d, a thickness of the second terminal electrode 16 in a width direction at the first main surface 10a side is smaller than a thickness of the second terminal electrode 16 in the width direction at the second main surface 10b side. These terminal electrodes 15 and 16 can be formed by applying a conductive paste and then drying the conductive paste in a state where the second main surface 10b faces downward in a vertical direction.

The multilayer ceramic capacitor 1 can be manufactured with the above-described procedure.

The manufactured multilayer ceramic capacitors 1 are accommodated in the tape 33 and the series of electronic components stored in a tape 3 is thus manufactured. Specifically, first, the multilayer ceramic capacitors 1 are sequentially transferred into the cavities 31 of the carrier tape 30. At this time, the multilayer ceramic capacitors 1 are transferred into the cavities 31 such that the first main surfaces 10a of the multilayer ceramic capacitors 1 face the bottom surfaces of the cavities 31. After that, the cavities 31 are sealed by affixing the cover tape 32 to the upper surface of the carrier tape 30. Thus, the series of electronic components stored in a tape 3 can be manufactured.

The first main surfaces 10a of at least two multilayer ceramic capacitors 1 arranged in a row face the bottom surfaces of the cavities 31. Preferably, the first main surfaces 10a of 5 or more multilayer ceramic capacitors 1 arranged in a row face the bottom surfaces of the cavities 31.

When the multilayer ceramic capacitors 1 are to be mounted on mounting substrates 40, the cover tape 32 is peeled off from the carrier tape 30, thus exposing the cavities 31. Next, a mounter having a suction nozzle sucks and holds a multilayer ceramic capacitor 1 inside a cavity 31. The multilayer ceramic capacitor 1 is arranged such that the first main surface 10a faces the bottom surface of the cavity 31. Therefore, the mounter sucks the second main surface 10b. Next, the mounter is moved and the multilayer ceramic capacitor 1 is taken out of the cavity 31. The mounter moves and arranges the multilayer ceramic capacitor 1 at a position on a mounting surface of the mounting substrate 40 where the multilayer ceramic capacitor 1 is to be mounted. Therefore, the multilayer ceramic capacitor 1 is arranged such that the first main surface 10a side thereof faces the mounting surface. In this preferred embodiment, the first main surface 10a, which faces the bottom surface of the cavity 31, faces the mounting surface. Next, the multilayer ceramic capacitor 1 arranged on the mounting substrate 40 is mounted on the mounting substrate 40 using a bonding material such as solder. With the above-described steps, the mounting structure of the multilayer ceramic capacitor 1 is manufactured.

Figure 10:
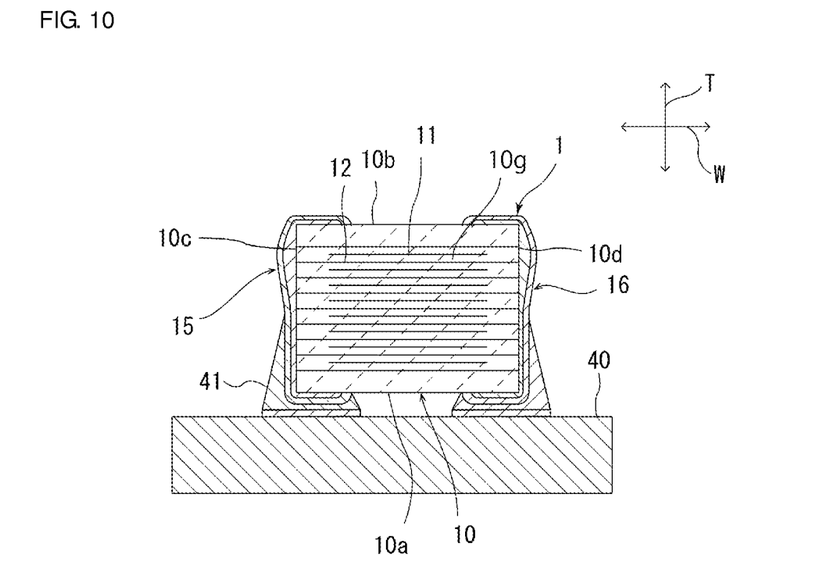
FIG. 10 is a schematic sectional view of a multilayer ceramic capacitor mounting structure of a preferred embodiment of the present invention.

As illustrated in FIG. 10, in the mounting structure of the multilayer ceramic capacitor 1, the relatively thin portions of the terminal electrodes 15 and 16 on the first main surface 10a side are bonded to joints 41 of solder or the like and the relatively thick portions of the terminal electrodes 15 and 16 on the second main surface 10b side are exposed from the joints 41. Therefore, since the relatively thin portions of the terminal electrodes 15 and 16 on the first main surface 10a side are covered by the joints 41, the mounted multilayer ceramic capacitor 1 has excellent moisture resistance reliability.

Multilayer ceramic capacitors have a plane of symmetry perpendicular to the height direction T. Therefore, there is no need for the orientation of a multilayer ceramic capacitor in the height direction to be identified. Consequently, it is usual for a multilayer ceramic capacitor to be transferred to a cavity of a tape without identifying the orientation of the multilayer ceramic capacitor in the height direction. Therefore, transferred multilayer ceramic capacitors include multilayer ceramic capacitors whose first main surfaces face the bottom surfaces of the cavities 31 and multilayer ceramic capacitors whose second main surfaces face the bottom surfaces of the cavities 31. Therefore, there is a mixture of multilayer ceramic capacitors mounted such that their first main surfaces face the mounting surface and multilayer ceramic capacitors mounted such that their second main surfaces face the mounting surface.

The present inventors discovered that the moisture resistance reliabilities of mounted multilayer ceramic capacitors were non-uniform when the thickness in the width direction of the terminal electrodes on the side surfaces at one main surface side is smaller than the thickness in the width direction of the terminal electrodes at the other main surface side. As a result of further diligent studies, the present inventors discovered that excellent moisture resistance reliability is obtained when the portions of the terminal electrodes having a relatively small thickness are covered by the bonding material and that the moisture resistance reliability is degraded when the portions of the terminal electrodes having a relatively small thickness are not covered by the bonding material. Accordingly, the present inventors thought of ensuring that the portions of the terminal electrodes 15 and 16 on the first main surface 10a side having a relatively small thickness are covered by the bonding material by making the multilayer ceramic capacitor 1 be accommodated in the cavity 31 such that the first main surface 10a faces the bottom surface of the cavity 31. By doing this, the portions of the terminal electrodes 15 and 16 on the first main surface 10a side having a relatively small thickness are definitely covered by the bonding material and therefore the moisture resistance reliability of the multilayer ceramic capacitor 1 after being mounted can be improved.

In this preferred embodiment, as described above, on the first side surface 10c, a thickness in the width direction of the first terminal electrode 15 at the first main surface 10a side is smaller than a thickness in the width direction of the first terminal electrode 15 at the second main surface 10b side. On the second side surface 10d, a thickness in the width direction of the second terminal electrode 16 at the first main surface 10a side is smaller than a thickness in the width direction of the second terminal electrode 16 at the second main surface 10b side. Consequently, it is possible to identify the orientations of the electronic components on the basis of differences in the thicknesses of the first and second terminal electrodes 15 and 16. Therefore, the multilayer ceramic capacitor 1 is able to be easily arranged such that the first main surface 10a side thereof faces the mounting surface. Therefore, the multilayer ceramic capacitor 1 is able to be mounted with a desired orientation as described above. As a result, a mounting structure in which the mounted multilayer ceramic capacitor 1 has excellent moisture resistance reliability is achieved and provided.

It can be confirmed that the first main surface 10a is facing the bottom surface of the cavity 31 by using the following exemplary method. A multilayer ceramic capacitor 1 is taken out of a cavity 31 while maintaining the orientation the multilayer ceramic capacitor 1 had when arranged in the cavity 31. An end surface of the ceramic body 10 is ground down to ½ the length of the ceramic body 10 while maintaining the orientation of the multilayer ceramic capacitor 1 as is. An area of 30 µm of the obtained cross section is observed using a scanning electron microscope. The thickness in the width direction of a portion of each of the first and second terminal electrodes 15 and 16 that cover an inner electrode positioned farthermost toward the first main surface 10a side and the thickness in the width direction of a portion of each of the first and second terminal electrodes 15 and 16 that cover an inner electrode positioned farthermost toward the second main surface 10b side are measured. The thickness in the width direction of a portion of a terminal electrode that covers the inner electrode positioned farthermost toward the first main surface 10a side is the thickness of the terminal electrode at the first main surface 10a side. The thickness in the width direction of a portion of a terminal electrode that covers the inner electrode positioned farthermost toward the second main surface 10b side is the thickness of the terminal electrode at the second main surface 10b side. That is, in various preferred embodiments of the present invention, "thickness in the width direction of a terminal electrode on a side surface at the first main surface 10a side" means the thickness of a portion of the terminal electrode that covers the inner electrode positioned farthermost toward the first main surface 10a side. "Thickness in the width direction of a terminal electrode on a side surface at the second main surface 10b side" means the thickness of a portion of the terminal electrode that covers the inner electrode positioned farthermost toward the second main surface 10b side.

The first main surface 10a of all of the multilayer ceramic capacitors 1 arranged in the carrier tape 30 need not face the bottom surface of the cavity 31. It would be sufficient that the first main surface 10a of at least about 50% of the multilayer ceramic capacitors 1 arranged in the series of electronic components stored in a tape 3 be arranged so as to face the bottom surface of the cavity 31. It would be preferable that the first main surface 10a of at least about 70% of the multilayer ceramic capacitors 1 arranged in the series of electronic components stored in a tape 3 be arranged so as to face the bottom surface of the cavity 31 and it would be even more preferable that the first main surface 10a of at least about 90% of the multilayer ceramic capacitors 1 be arranged so as to face the bottom surface of the cavity 31.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A series of electronic components stored in a tape comprising:
    a tape including an elongated carrier tape including a plurality of cavities in a longitudinal direction of the carrier tape and a cover tape provided on top of the carrier tape so as to cover the plurality of cavities; and
    a plurality of electronic components respectively arranged in the plurality of cavities; wherein
    each of at least two of the plurality of electronic components arranged in a row includes:
        an electronic component body including first and second main surfaces that extend in a length direction and a width direction, first and second side surfaces that extend in the length direction and a height direction, and first and second end surfaces that extend in the width direction and the height direction;
        a first inner electrode provided inside the electronic component body and extending to the first and second side surfaces;
        a second inner electrode provided inside the electronic component body and extending to the first and second end surfaces;
        a first terminal electrode arranged on the first side surface and electrically connected to the first inner electrode;
        a second terminal electrode arranged on the second side surface and electrically connected to the first inner electrode;
        a third terminal electrode arranged on the first end surface and electrically connected to the second inner electrode; and
        a fourth terminal electrode arranged on the second end surface and electrically connected to the second inner electrode;
        on the first side surface, a thickness in the width direction of the first terminal electrode at the first main surface side is smaller than a thickness in the width direction of the first terminal electrode at the second main surface side;
        on the second side surface, a thickness in the width direction of the second terminal electrode at the first main surface side is smaller than a thickness in the width direction of the second terminal electrode at the second main surface side; and
        the first main surface of each of the at least two of the plurality of electronic components arranged in a row faces a bottom surface of the cavity.

2. The series of electronic components stored in a tape according to claim 1, wherein the first and second terminal electrodes each include a fired electrode layer.

3. The series of electronic components stored in a tape according to claim 2, wherein the fired layer includes glass.

4. The series of electronic components stored in a tape according to claim 1, wherein the plurality of electronic components are one of capacitors, piezoelectric components, thermistors and inductors.

5. The series of electronic components stored in a tape according to claim 1, wherein the first and second terminal electrodes each include a fired electrode layer and a plating layer on top of the fired electrode layer.

6. A manufacturing method for a series of electronic components stored in a tape including an elongated carrier tape including a plurality of cavities in a longitudinal direction of the carrier tape and a cover tape provided on top of the carrier tape so as to cover the plurality of cavities; and
a plurality of electronic components respectively arranged in the plurality of cavities; wherein
each of at least two of the plurality of electronic components arranged in a row includes:
an electronic component body including first and second main surfaces that extend in a length direction and a width direction, first and second side surfaces that extend in the length direction and a height direction, and first and second end surfaces that extend in the width direction and the height direction;
a first inner electrode provided inside the electronic component body and extending to the first and second side surfaces;
a second inner electrode provided inside the electronic component body and extending to the first and second end surfaces;
a first terminal electrode arranged on the first side surface and electrically connected to the first inner electrode;
a second terminal electrode arranged on the second side surface and electrically connected to the first inner electrode;
a third terminal electrode arranged on the first end surface and electrically connected to the second inner electrode; and
a fourth terminal electrode arranged on the second end surface and electrically connected to the second inner electrode;
on the first side surface, a thickness in the width direction of the first terminal electrode at the first main surface side is smaller than a thickness in the width direction of the first terminal electrode at the second main surface side;
on the second side surface, a thickness in the width direction of the second terminal electrode at the first main surface side is smaller than a thickness in the width direction of the second terminal electrode at the second main surface side; and
the first main surface of each of the at least two of the plurality of electronic components arranged in a row faces a bottom surface of the cavity;
the manufacturing method comprising:
a step of arranging each of the at least two of the plurality of electronic components arranged in a row so that the first main surface faces a bottom surface of the cavity.

7. The manufacturing method according to claim 6, wherein the first and second terminal electrodes each include a fired electrode layer.

8. The manufacturing method according to claim 7, wherein the fired layer includes glass.

9. The manufacturing method according to claim 6, wherein the plurality of electronic components are one of capacitors, piezoelectric components, thermistors and inductors.

10. The manufacturing method according to claim 6, wherein the first and second terminal electrodes each include a fired electrode layer and a plating layer on top of the fired electrode layer.

11. An electronic component comprising:
an electronic component body including first and second main surfaces that extend in a length direction and a width direction, first and second side surfaces that extend in the length direction and a height direction, and first and second end surfaces that extend in the width direction and the height direction;
a first inner electrode provided inside the electronic component body and extending to the first and second side surfaces;
a second inner electrode provided inside the electronic component body and extending to the first and second end surfaces;
a first terminal electrode arranged on the first side surface and electrically connected to the first inner electrode;
a second terminal electrode arranged on the second side surface and electrically connected to the first inner electrode;
a third terminal electrode arranged on the first end surface and electrically connected to the second inner electrode; and
a fourth terminal electrode arranged on the second end surface and electrically connected to the second inner electrode; wherein
on the first side surface, a thickness in the width direction of the first terminal electrode at the first main surface side is smaller than a thickness in the width direction of the first terminal electrode at the second main surface side; and
on the second side surface, a thickness in the width direction of the second terminal electrode at the first main surface side is smaller than a thickness in the width direction of the second terminal electrode at the second main surface side.

12. The electronic component according to claim 11, wherein the first and second terminal electrodes each include a fired electrode layer.

13. The electronic component according to claim 12, wherein the fired layer includes glass.

14. The electronic component according to claim 11, wherein the electronic component is one of a capacitor, a piezoelectric component, a thermistor and an inductor.

15. The electronic component according to claim 11, wherein the first and second terminal electrodes each include a fired electrode layer and a plating layer on top of the fired electrode layer.

* * * * *